United States Patent [19]
Mottahed

[11] Patent Number: 5,550,526
[45] Date of Patent: Aug. 27, 1996

[54] THERMAL DETECTION ELEMENTS WITH HEATER

[75] Inventor: Behzad D. Mottahed, Upper Montclair, N.J.

[73] Assignee: Lucent Technologies Inc., Murray Hill, N.J.

[21] Appl. No.: 364,626

[22] Filed: Dec. 27, 1994

[51] Int. Cl.⁶ .................................................... H01C 7/10
[52] U.S. Cl. .......................... 338/22 R; 361/103; 338/25; 257/467
[58] Field of Search .................................. 338/22 R, 25; 361/103; 257/467

[56] References Cited

U.S. PATENT DOCUMENTS

| | | | |
|---|---|---|---|
| 4,866,559 | 12/1989 | Cobb, III et al. | 361/103 |
| 5,057,811 | 10/1991 | Strott et al. | 338/22 R |
| 5,140,394 | 8/1992 | Cobb, III et al. | 257/467 |

OTHER PUBLICATIONS

Printed Circuits Handbook, author: C. F. Coombs, Jr., McGraw–Book Co., Chapter 4, "Engineering Packaging Interconnection System", pp. 4.3–4.28.

Primary Examiner—Tu Hoang
Assistant Examiner—Karl Easthom
Attorney, Agent, or Firm—Lester H. Birnbaum

[57] ABSTRACT

The present invention provides thermal detection elements having a controlled relationship between a thermal radiating and thermal sensing element. The thermal detection element includes an insulating substrate having a plurality of conductive interconnection elements formed on the substrate to permit electrical connection of the substrate with other electrical components. A thermal radiating element is at least partially embedded within the substrate and mounted such it electrically communicates with at least one of the conductive interconnection elements. A thermal sensing element is mounted adjacent the thermal radiating element such that a substantial portion of the thermal energy radiated by the thermal radiating element is channeled to the thermal sensing element. The thermal sensing element is also mounted such that it electrically communicates with at least one of the conductive interconnection elements.

10 Claims, 4 Drawing Sheets

THERMAL DETECTION ELEMENTS WITH HEATER

FIELD OF THE INVENTION

The invention relates to thermal detection elements, and, more particularly, to thermal detection elements employed in power detection circuits.

BACKGROUND OF THE INVENTION

It is often desirable to measure the average power of a particular signal. In the past, average signal power has been measured with diode detector circuits, particularly when the signal of interest is an a.c. signal in the radio-frequency range. In a diode detector circuit, the signal to be measured is placed across a diode while the diode is biased to be within the "square-law" region. In the square-law region, the voltage across the diode is proportional to the input signal power. As long as the input signal does not drive the diode out of the square law region, the signal power will be accurately measured. However, when the signal to be measured is complex, e.g., when the signal has multiple sinusoidal components, the respective sinusoidal components can constructively interfere, driving the diode out of the square-law region. This results in an inaccurate power measurement by the detector circuit. Other detector circuit inaccuracies occur with changes in ambient temperature, deleteriously affecting the power-measurement ability of the circuit.

In U.S. Pat. No. 5,376,880, the disclosure of which is incorporated herein by reference, a novel power detection circuit is disclosed which overcomes the disadvantages of the above diode power detector circuits. In the '880 patent, average power is measured, in an exemplary embodiment, through a circuit that employs first and second thermal detectors, an error amplifier, and a summer. The first thermal detector provides a reference signal to the error amplifier. The summer receives an input signal to be measured and the signal output from the error amplifier. The summer feeds a composite signal, that is, a signal indicative of the sum of the power of the input signal and the output signal from the error amplifier, to a second thermal detector. The second thermal detector receives the composite signal and outputs a feedback signal, indicative of the power of the composite signal, to the error amplifier. The error amplifier subtracts the feedback signal from the reference signal to produce an amplifier output signal indicative of the power of the input signal. This signal is amplified and output to the summer.

In an exemplary embodiment, the thermal detector comprises a combination of a thermal radiating element and a thermal sensor. A resistor is advantageously employed as the thermal radiator while a thermistor is advantageously employed as the thermal sensor. Because the thermal detector's output signal is based on the interaction of the thermal radiator and the thermal sensor, it is important to ensure a precise and reproducible relationship between these components. The present invention relates to thermal detectors and low-cost methods for their construction that create such a precise and reproducible relationship between thermal radiator and thermal sensor components.

SUMMARY OF THE INVENTION

The present invention provides cost-effective thermal detection elements having a controlled relationship between a thermal radiating and thermal sensing element. The thermal detection element comprises an insulating substrate having a plurality of conductive interconnection elements formed on the substrate to permit electrical connection of the substrate with other electrical components. A thermal radiating element is at least partially embedded within the substrate and mounted such that it electrically communicates with at least one of the conductive interconnection elements. A thermal sensing element is mounted adjacent the thermal radiating element such that a substantial portion of the thermal energy radiated by the thermal radiating element is channeled to the thermal sensing element. The thermal sensing element is also mounted such that it electrically communicates with at least one of the conductive interconnection elements. Through this configuration, low-cost, reliable, thermal detection elements are created which give accurate and reproducible signal outputs.

DETAILED DESCRIPTION

Figure 1:
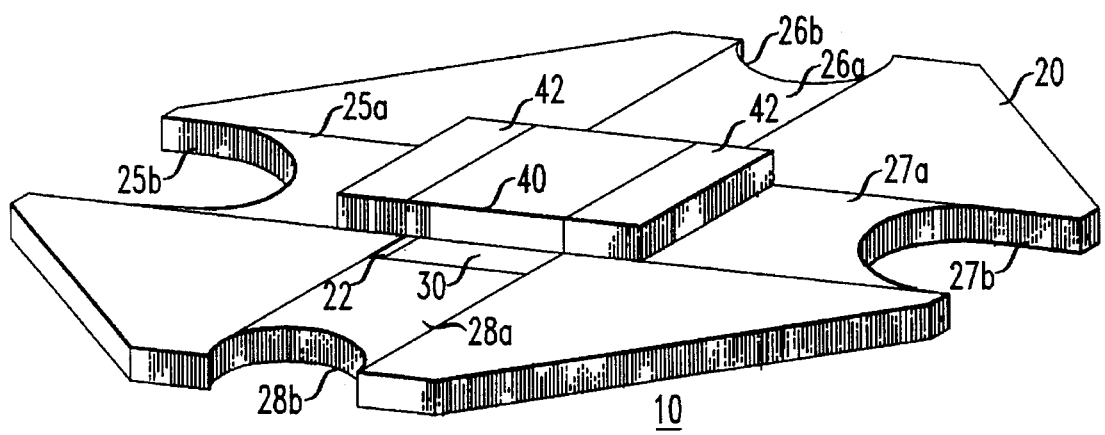
FIG. 1 is a perspective view of a thermal detection element according to the present invention.

Turning to the drawings in detail in which like numerals indicate the same or similar elements in each of the several views, FIG. 1 depicts a thermal detection element 10 according to one embodiment of the present invention. Thermal detection element 10 includes a substrate 20 with a thermal radiating element 30 at least partially embedded within substrate aperture 22. In a preferred embodiment, thermal radiating element 30 is situated within aperture 22 such that its surface is substantially flush with the upper surface of the substrate. A thermal sensing element 40 is disposed on substrate 20 adjacent thermal radiating element 30 such that the edges of the thermal sensing element contact at least a portion of the substrate region surrounding the thermal radiating element. Preferably the dimensions of the thermal sensing element are selected such that it substantially covers the exposed upper surface of the thermal radiating element.

Both the thermal radiating element 30 and the thermal sensing element 40 contact conductive regions of substrate 20, typically through solder bonds. Thermal radiating element 30 contacts conductive regions 26A and 28A while thermal sensing element 40 contacts conductive regions 25A and 27A, best seen in FIG. 2A. Each of conductive regions 25A, 26A, 27A, and 28A respectively communicates with substantially vertical conductive edge regions 25B, 26B, 27B, and 28B. These edge regions in turn communicate with conductive regions disposed on the lower surface of substrate 20, best seen in FIG. 2B.

Figure 2A:
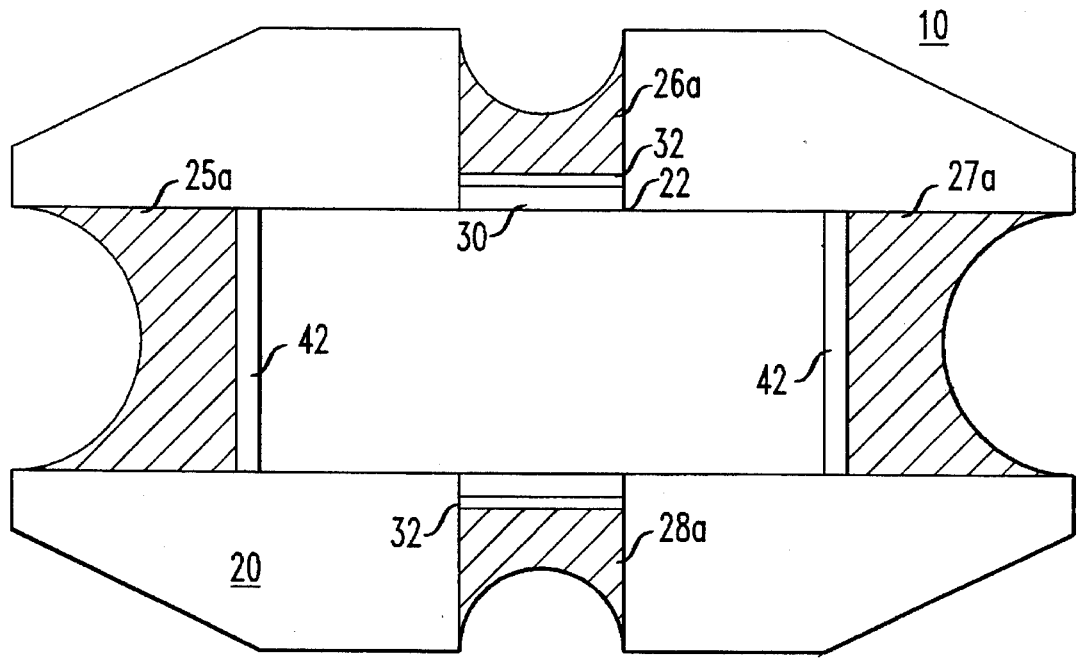
FIG. 2A is a top view of the thermal detection element of FIG. 1.
Figure 2B:
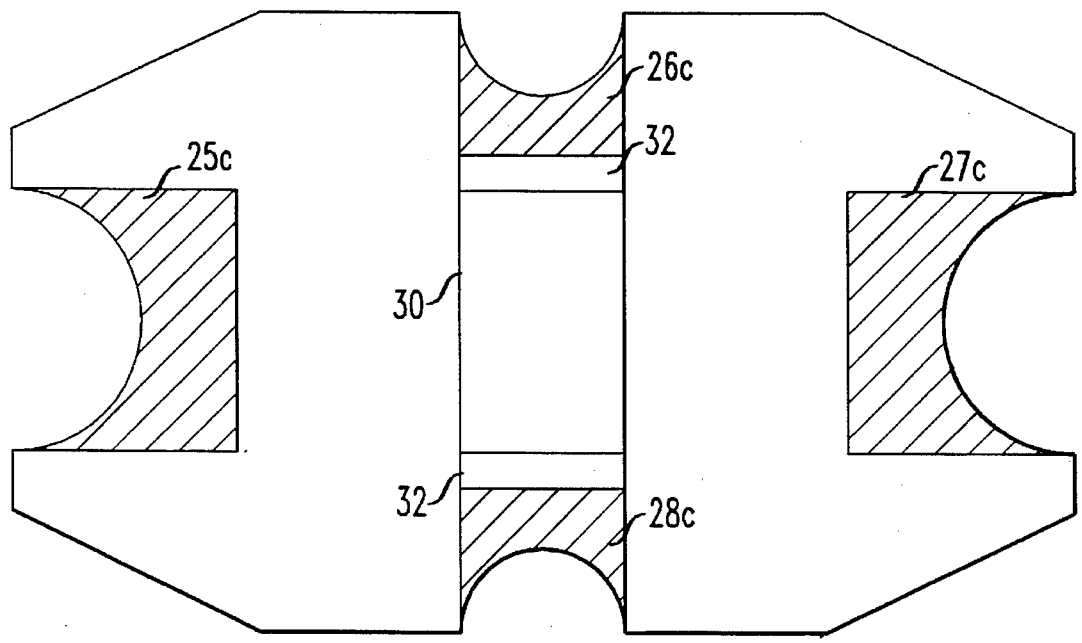
FIG. 2B is a bottom view of the thermal detection element of FIG. 1.

FIGS. 2A and 2B respectively depict top and bottom views of the thermal detection element 10. FIG. 2A clearly depicts the pattern of upper surface conductive regions 25A, 26A, 27A, and 28A. Through the conductive edge regions 25B, 26B, 27B, and 28B shown in FIG. 1, these upper surface conductive regions electrically communicate with lower surface conductive regions 25C, 26C, 27C, and 28C shown in FIG. 2B. While conductive edge regions are depicted in FIGS. 1–2, it is understood that conductive vias formed by through-holes within the substrate or any other configuration that forms a conductive path through the substrate can be used to connect the upper and lower conductive regions. The lower surface conductive regions permit interconnection of thermal detection element 10 with other circuit elements. The compact, low-profile configuration of thermal detection element 10 makes it advantageous for use in integrated circuit assemblies as a surface-mountable component.

Thermal radiating element 30 of thermal detector 10 typically comprises a resistor, as depicted in FIGS. 1–2. The resistor is provided with edge conductive regions 32 to facilitate electrical connection with the substrate conductive regions. To reduce loss of the signal input to the thermal radiating element and thus assure proper power dissipation, the impedances of the substrate conductive regions 26A and 28A should approximate the impedances of the thermal radiator element conductive regions 32. One way to accomplish this is to construct the widths of substrate conductive regions 26A and 28A such that they are substantially similar to the width of thermal radiator element conductive regions 32. Similarly, the width of the input signal line, typically disposed on a parent substrate board, should approximate the width of conductive regions 26A, 28A, and 32 to substantially match impedances.

By at least partially embedding the thermal radiating element within the substrate, the heat dissipated by the radiator is channeled to thermal sensing element 40. While the thermal radiating element is depicted as mounted within a substrate aperture, it is understood that the radiator can be mounted in a recessed portion of substrate 22 that opens only to the upper substrate surface. The use of a recessed substrate portion for the thermal radiator further assists in channeling heat generated by the thermal radiator to the thermal sensing element.

The thermal sensing element 40 of FIGS. 1–2 is a thermistor, preferably, a thermistor having a negative temperature coefficient. To permit connection with the conductive regions, the thermistor includes conductive edge regions 42. Although depicted as a thermistor, thermal sensing element 40 can be selected from numerous devices including, but not limited to, thermocouples, temperature-sensing integrated circuits, and semiconductor diodes. While the depicted embodiment places the thermal sensing element on the substrate surface, it is understood that the thickness of the substrate can be selected such that both the thermal radiating element and the thermal sensing element are each at least partially embedded within the substrate. Such an embodiment can be employed to fabricate a thermal detection element having a level upper surface.

To enhance the thermal coupling between thermal radiator element 30 and thermal sensing element 40, high thermal conductivity epoxy is optionally interposed between the two elements. In addition to enhancing thermal transfer, the high thermal conductivity epoxy helps ensure that the surface of thermal radiator 30 is flush with substrate 20, providing a level surface upon which to mount the thermal sensing element. The thermal radiator/thermal sensor assembly can optionally be encapsulated in insulating epoxy to further ensure that the thermal energy from thermal radiator 30 is transferred to the thermal sensing element and reduce the influence of ambient conditions on the thermal sensing element.

Figure 3:
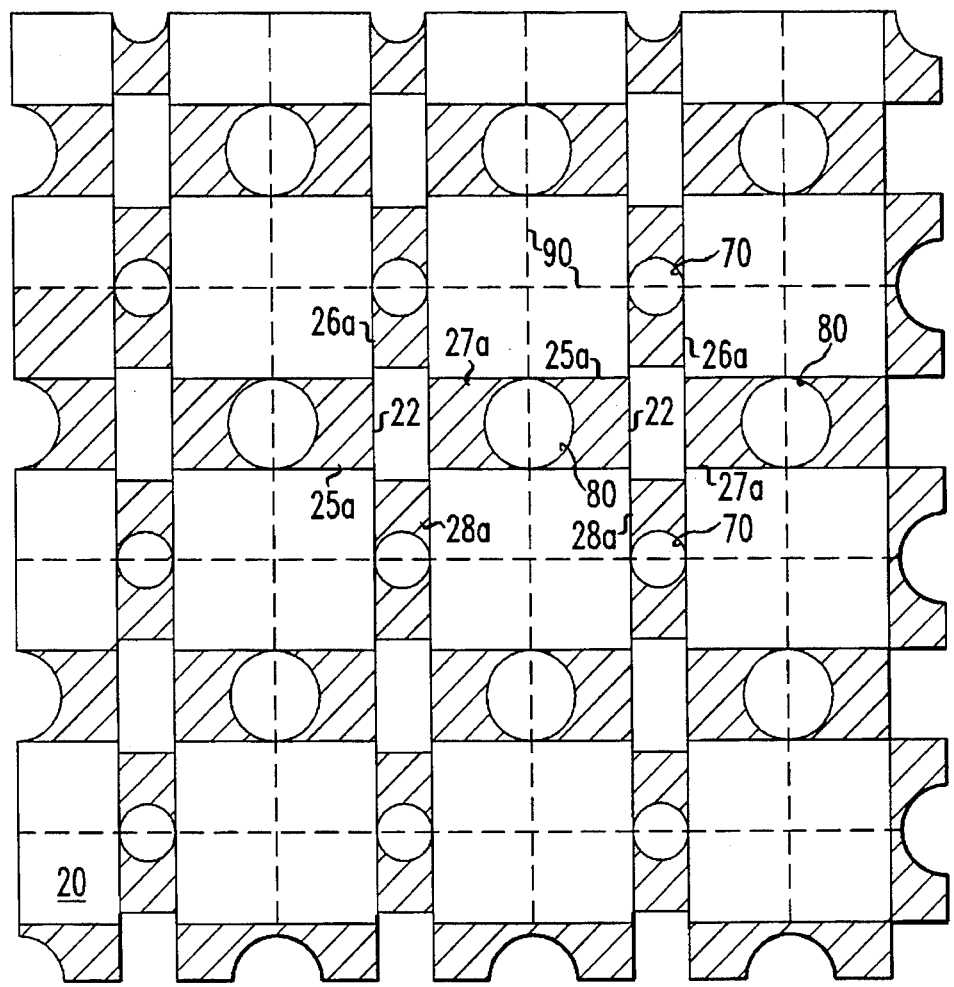
FIG. 3 depicts a plated substrate board used to fabricate a plurality of thermal detection elements.

To reduce the cost of assembly, the thermal detectors of the present invention are fabricated in large arrays followed by singularization to create individual devices. FIG. 3 depicts a substrate board 20, such as 20 mil. FR-4 (fiber-reinforced epoxy) board having a metallization pattern for plural thermal detection elements. The substrate board is initially provided in the form of a double-sided copper laminate, i.e., an FR-4 insulating inner layer with upper and lower surfaces of laminated copper foil. Small circular apertures 70 and larger circular apertures 80 are formed in substrate 20, typically through drilling. The sidewalls of these apertures will form conductive edge regions 25B, 26B, 27B, and 28B in the completed devices. The aperture sidewalls are then catalyzed in preparation for electroless copper deposition. Alternatively, the use of a catalytic copper-clad board eliminates the need to catalyze aperture walls.

To form the desired conductor pattern, resist is applied to the board in regions where metallization is required. For the array of FIG. 3, resist is applied in regions 25A–28A on the upper surface and 25C–28C on the lower surface. The exposed copper foil is etched and the resist removed, leaving the desired surface metallization pattern. A second resist pattern is then formed, leaving exposed the aperture sidewalls and, optionally, the surface metallization. Copper is electrolessly deposited on the aperture sidewalls (and surface metallization, if exposed) to the desired thickness. The resist is then removed, leaving the copper metallization pattern. To protect the copper surfaces from oxidation, an oxidation-resistant metal such as zinc or nickel is optionally plated on the metallization pattern.

Substrate apertures 22 for receiving the thermal radiator elements are formed following formation of the metallization pattern. The aperture dimensions are slightly larger than those of the thermal radiator elements which they house, to accommodate thermal expansion. Optionally, these apertures can be formed simultaneously with apertures 70 and 80 if it is desired to plate the sidewalls of aperture 22 Following radiator aperture formation, the substrate array appears as depicted in FIG. 3 Thermal radiator elements 30 are inserted in apertures 22 and soldered to conductive regions 26A and 28A on the upper surface and conductive regions 26C and 28C on the lower surface. Following assembly of the thermal radiators, high thermal conductivity epoxy is optionally printed, approximately 1–2 mils thick, on the thermal radiator surfaces. Thermal sensors 40 are placed on the substrate surface, contacting the epoxy and conductive regions 25A and 27A. Separation of individual thermal detector elements is made along dashed scribe lines 90. Alternatively, individual substrates can be separated, followed by assembly of the thermal radiator and thermal sensor elements. To create the substrate geometry of FIGS. 1 and 2, the devices can optionally be trimmed to remove the four corners, or the substrate can retain the as-formed rectangular geometry from the FIG. 3 array.

Alternatively, the thermal detection elements can be formed using multilayer ceramic tape technologies. In the multilayer process, substrate features are punched into individual unfired ("green") ceramic tape layers. The layers are assembled and laminated to form the substrate array. Multilayer ceramic techniques are particularly suited to the formation of substrate recesses for the thermal radiating elements. To form a recess, several tape layers are punched to create apertures followed by lamination to unpunched tape layers. The unpunched layers form the lower surface of the recess. Using green ceramic substrates, metallization is typically applied through screen printing of silver and/or palladium pastes, followed by firing. Other techniques suitable for the formation of thermal detection elements of the present invention are described in Coombs, Jr. *Printed Circuits Handbook*, (McGraw-Hill, Inc., N.Y.), c. 1988, the disclosure of which is incorporated by reference herein.

Figure 4:
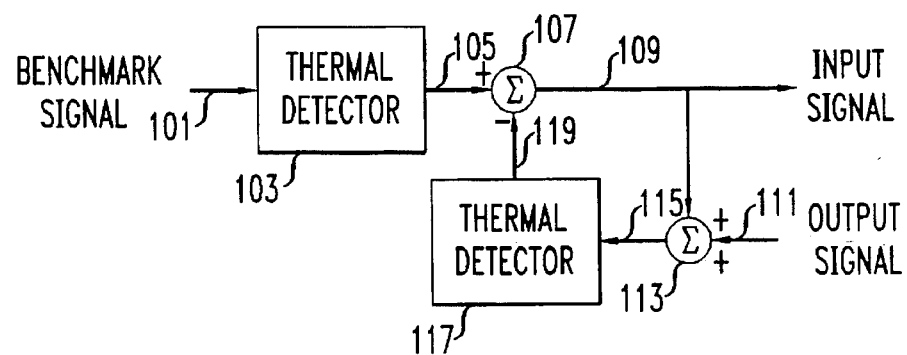
FIG. 4 is a block diagram of a power detection circuit which employs the thermal detectors of the present invention.

The thermal detection elements of the present invention are advantageously employed in the power detection circuit schematically depicted in FIG. 4. The thermal detection circuit includes thermal detectors 103 and 117, error amplifier 107, and summer 113. In operation, thermal detector 103 receives a benchmark signal, i.e., a signal of known voltage and power, through lead 101. In response, thermal detector 103 outputs onto lead 105 a reference signal proportional to the power of the benchmark signal, modulated by ambient temperature. This reference signal is input to error amplifier 107.

A signal whose power is to be measured is input to summer 113 through lead 111. Summer 113 also receives an output signal from error amplifier 107. The resultant composite signal is input to thermal detector 117 through lead 115. Thermal detector 117 produces a feedback signal, proportional to the power of the composite signal, and outputs the feedback signal to error amplifier 107 through lead 119.

Figure 5:
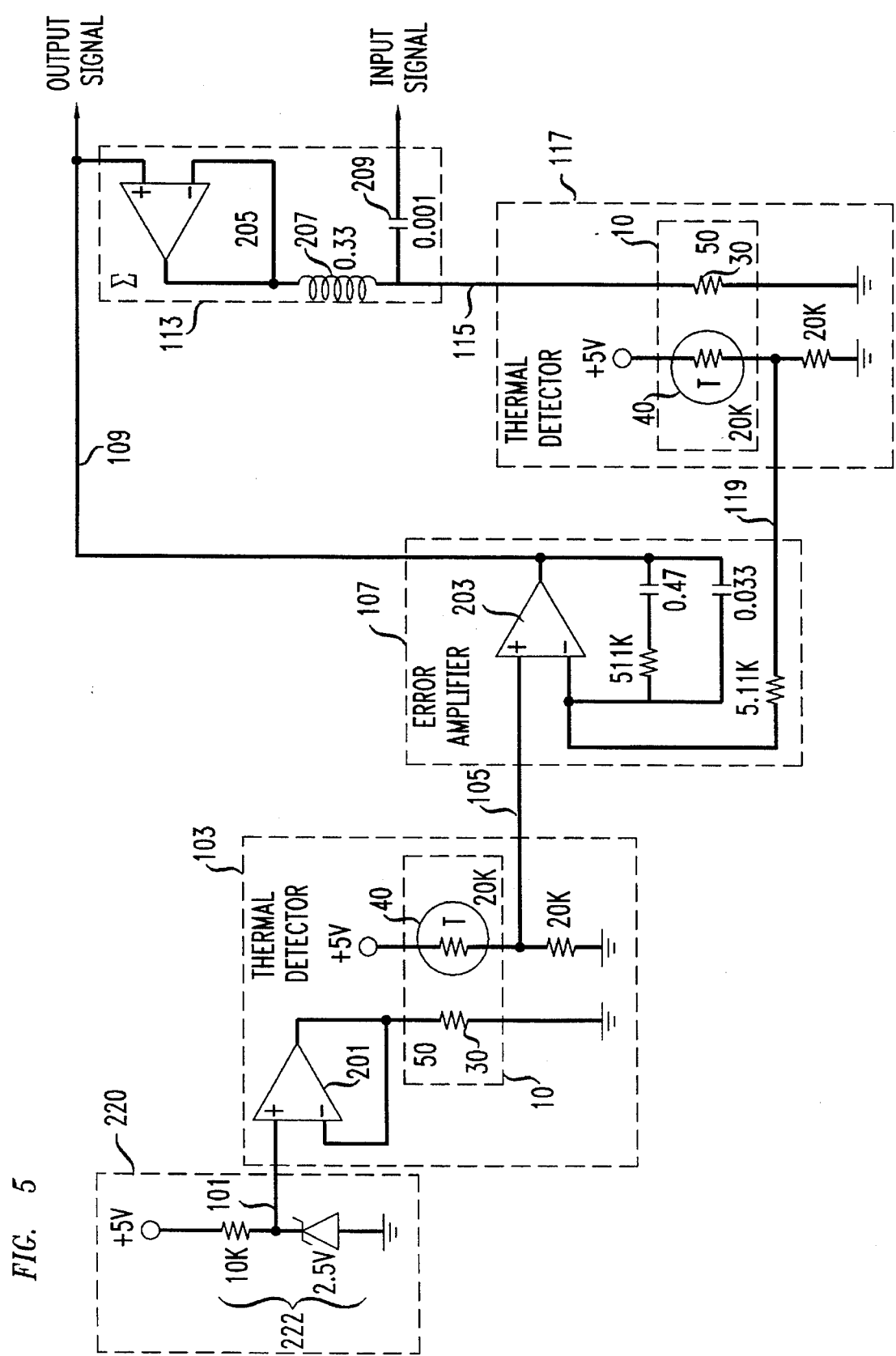
FIG. 5 is a schematic diagram of the power detection circuit of FIG. 4.

Error amplifier 107 receives the reference signal through lead 105 and the feedback signal through lead 119. The error amplifier subtracts the feedback signal from the reference signal and amplifies the difference. This difference forms an output signal indicative of the average power of the input signal FIG. 5 depicts an illustrative embodiment of the power detection circuit of FIG. 4 illustrating its component elements. For purposes of this description, resistor values are given in ohms, capacitor values in micro-farads, and inductor values in micro-henrys. As seen in FIG. 5, voltage source 220 provides the benchmark signal. Voltage source 220, for a d.c. benchmark signal, includes a resistor-diode pair 222 to provide a temperature-stable d.c. reference voltage on lead 101. While illustratively depicted as a d.c. voltage source, it is understood that an a.c. voltage source can be substituted for voltage source 220.

The benchmark signal is received by thermal detector 103. Thermal detector 103 includes thermal detection element 10 and, optionally, operational amplifier 201. In the embodiment of FIG. 5, thermal detection element 10 comprises a 50-ohm resistor as radiator 22 and a thermistor as thermal sensor 40. The benchmark signal from voltage source 220 is input to operational amplifier 201. The buffered signal drives the 50-ohm resistor, partially dissipating its power as thermal energy. This thermal energy is received by thermistor 40, which modulates the output signal on lead 105 by both the energy radiated from the 50-ohm resistor and the ambient temperature.

Similarly, a second thermal detector 117 is positioned to receive a composite signal comprised of an input signal whose power is to be measured and an output signal from error amplifier 107. As in thermal detector 103, thermal detector 117 includes thermal detection element 10. The composite signal drives thermal radiator element 22, depicted as a 50 ohm resistor. The dissipated thermal energy is at least partially received by the thermistor 40 which modulates the feedback signal based on this thermal energy and the ambient temperature.

Summer 113 comprises operational amplifier 205 communicating with inductor 207 and capacitor 209. Summer 113 receives an output signal from lead 109 and buffers it with operational amplifier 205. Summer 113 also receives the input signal whose power is to measured from lead 111 and feeds it through capacitor 209. The output of operational amplifier 205 passes through inductor 207 where it is added to the input signal. The resultant composite signal is output onto lead 115 where it is sent to thermal detector 117, discussed above.

Error amplifier 107 receives the reference signal from lead 105 and feeds it into the non-inverting input of operational amplifier 203. Error amplifier 107 also receives the feedback signal from lead 119 and feeds it through a 5.11K-ohm resistor into the inverting input of operational amplifier 203. Operational amplifier 203 has associated with it a 511K-ohm resistor and two capacitors, having the values shown in FIG. 5, for stabilization. The output of operational amplifier 203 is the output signal on lead 109. This output signal varies inversely with the power of the input signal and is therefore used to determine the average power of the input signal. It is understood that the component values are illustrative only. Selected resistor and capacitor values will depend upon a variety of factors including, but not limited to, the thermal transfer characteristics of the radiator elements and the thermal sensing elements.

Because both thermal detectors 103 and 117 are influenced by ambient temperature as well as by the thermal energy dissipated by their respective thermal radiator elements, it is important that the thermal detection elements produce equivalent responses for any given input Typically, matched thermal sensing elements, such as matched thermistors, provide the desired equivalent responses. The thermal detection elements 10 of the present invention, by carefully controlling the interaction between the thermal radiating and thermal sensing elements and the interaction with the ambient environment, assure consistent and reproducible signal outputs, providing accurate power detection circuits.

While the foregoing invention has been described in terms of the above embodiments, numerous modifications can be made. Accordingly, modifications such as those suggested above, but not limited thereto, are to be considered within the scope of the claims.

I claim:

1. A thermal detection element comprising:

an insulating substrate including an aperture formed therein;

a plurality of conductive interconnection elements formed on the substrate, the conductive interconnection elements configured for electrical connection of the thermal detection element with other electrical components;

a resistor positioned within the substrate aperture such that its upper surface is substantially flush with the upper surface of the substrate, the resistor electrically communicating with at least one of the conductive interconnection elements; and a resistor mounted adjacent the thermal radiating element such that a substantial portion of the thermal energy radiated by the resistor is channeled to the thermal sensing element, the thermal sensing element electrically communicating with at least one of the conductive interconnection elements.

2. A thermal detection element according to claim 1 wherein the thermal sensing element is selected from thermistors, thermocouples, temperature-sensing integrated circuits, and semiconductor diodes.

3. A thermal detection element according to claim 1 wherein the thermal sensing element is a thermistor.

4. A thermal detection element according to claim 1 wherein the thermal sensing element is positioned such that it substantially covers the upper surface of the thermal radiator element.

5. A power detection circuit incorporating the thermal sensing element of claim 1.

6. A thermal detection element comprising:

an insulating substrate, the substrate including an aperture, substantially planar upper and lower surfaces, and substantially vertical edge surfaces;

a first pair of lower conductive regions disposed on the lower substrate surface;

a first pair of upper conductive regions disposed on the upper substrate surface a first pair of edge conductive regions for interconnecting the first pair of upper conductive regions with the first pair of lower conductive regions;

a resistor positioned within the substrate aperture such that its upper surface is substantially flush with the upper surface of the substrate, the resistor electrically communicating with at least the first pair of upper conductive regions;

a second pair of upper conductive regions disposed on the upper substrate surface, the second pair of upper conductive regions separated from the first pair of upper conductive regions by insulating substrate regions;

a second pair of lower conductive regions disposed on the lower substrate surface, the second pair of lower conductive regions being separated from the first pair of lower conductive regions by insulating substrate regions;

a second pair of edge conductive regions for interconnecting the second pair of upper conductive regions with the second pair of lower conductive regions, the second pair of edge conductive regions being separated from the first pair of edge conductive regions by substrate insulating regions;

a thermal sensing elements mounted adjacent the upper surface of the substrate such that the thermal sensing element is positioned adjacent the resistor and contacts at least a portion of the substrate region which is at least partially surrounding the resistor, the thermal sensing element electrically communicating with the second pair of upper conductive regions.

7. A thermal detection according to claim 6 wherein the resistor is selected from thermistors, thermocouples, temperature-sensing integrated circuits, and semiconductor diodes.

8. A thermal detection element according to claim 6 wherein the thermal sensing element is a thermistor.

9. A thermal detection element according to claim 6 wherein the thermal sensing element is positioned such that it substantially covers the upper surface of the thermal radiator element.

10. A power detection circuit incorporating the thermal sensing element of claim 6.

* * * * *